US012755940B2

(12) United States Patent
Ashida

(10) Patent No.: US 12,755,940 B2
(45) Date of Patent: Oct. 6, 2026

(54) PLASMA PROCESSING APPARATUS

(71) Applicant: TOKYO ELECTRON LIMITED, Tokyo (JP)

(72) Inventor: Mitsutoshi Ashida, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 29 days.

(21) Appl. No.: 18/855,230

(22) PCT Filed: Mar. 31, 2023

(86) PCT No.: PCT/JP2023/013670
§ 371 (c)(1),
(2) Date: Oct. 8, 2024

(87) PCT Pub. No.: WO2023/199766
PCT Pub. Date: Oct. 19, 2023

(65) Prior Publication Data
US 2025/0299923 A1 Sep. 25, 2025

(30) Foreign Application Priority Data
Apr. 11, 2022 (JP) ................................. 2022-064956

(51) Int. Cl.
*H01J 37/32* (2006.01)

(52) U.S. Cl.
CPC .............................. *H01J 37/32266* (2013.01)

(58) Field of Classification Search
CPC .......... H01J 37/32266; H01J 37/32311; H05H 1/00; H05H 1/46
See application file for complete search history.

(56) References Cited

U.S. PATENT DOCUMENTS

2018/0151332 A1* 5/2018 Kaneko ............. H01J 37/32275

FOREIGN PATENT DOCUMENTS

| | | |
|---|---|---|
| JP | 2019-194943 A | 11/2019 |
| JP | 2021-180070 A | 11/2021 |
| WO | WO 2016/104098 A1 | 6/2016 |

OTHER PUBLICATIONS

PCT International Search Report, PCT Application No. PCT/JP2023/013670, dated Jun. 13, 2023, 9 pages (with English Translation of PCT International Search Report).

* cited by examiner

*Primary Examiner* — Henry Luong
(74) *Attorney, Agent, or Firm* — Fenwick & West LLP

(57) ABSTRACT

A plasma processing apparatus is provided in one exemplary embodiment. A microwave output device of the plasma processing apparatus is configured to output microwaves that are provided into a chamber, and a controller is configured to control the operation of the microwave output device. The microwaves outputted by the microwave output device include an output wave for transmitting a power used for plasma generation, and a broadband sweep wave group used for detection of a plasma state. In the microwave output device, a modulator modulates the microwaves and transmits the modulated microwaves to a waveguide, and a demodulator receives and demodulates a reflected wave group obtained by the sweep wave group being reflected by plasma in the chamber. The controller is configured to determine a frequency of the output wave based on the reflected wave group, and control the microwave output device to output the output wave of the frequency.

8 Claims, 4 Drawing Sheets

PLASMA PROCESSING APPARATUS

TECHNICAL FIELD

An exemplary embodiment of the present disclosure relates to a plasma processing apparatus.

BACKGROUND

A plasma processing apparatus is used for manufacturing electronic devices such as semiconductor devices. There are several types of plasma processing apparatuses, such as a capacitively coupled plasma processing apparatus and the like, and a plasma processing apparatus for generating plasma by exciting a gas using microwaves is also used. Patent Document 1 discloses a plasma processing apparatus using microwaves.

PRIOR ART DOCUMENTS

Patent Documents

Patent document 1: Japanese Laid-open Patent Publication No. 2019-194943

SUMMARY

Problems to be Resolved by the Invention

The present disclosure provides a technique for easily adjusting an output wave by a frequency of microwaves used for plasma generation.

Means for Solving the Problems

A plasma processing apparatus is provided in accordance with one exemplary embodiment. The plasma processing apparatus comprises a chamber, a microwave output device and a controller. The microwave output device is configured to output microwaves provided into the chamber via a waveguide and an antenna. The controller is configured to control an operation of the microwave output device. The microwaves outputted by the microwave output device include an output wave for transmitting a power used for plasma generation and a broadband sweep wave group used for detection of a plasma state in the chamber. The microwave output device includes a modulator and a demodulator. The modulator is configured to modulate the microwaves and transmit the modulated microwaves to the waveguide. The demodulator is configured to receive, via the waveguide, and demodulate a reflected wave group obtained by the sweep wave group being reflected by plasma in the chamber, the sweep wave group being included in the microwaves transmitted to the waveguide by the modulator and provided into the chamber via the antenna. The controller is configured to determine a frequency of the output wave based on the reflected wave group, and control the microwave output device to output the output wave of the frequency.

Effect of the Invention

In accordance with one exemplary embodiment, the output wave can be easily adjusted depending on the frequency of the microwaves used for plasma generation.

DETAILED DESCRIPTION

Figure 1:
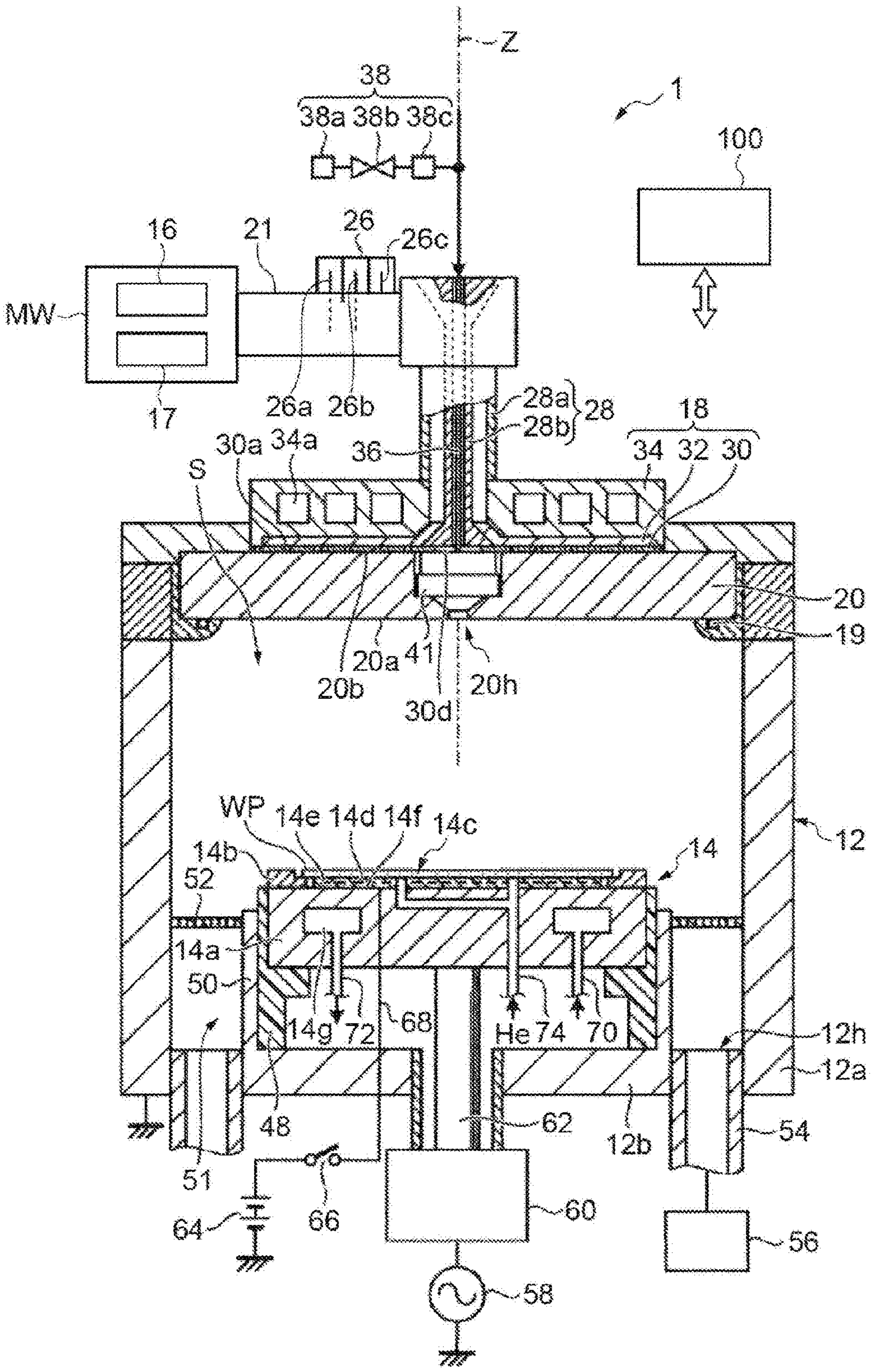
FIG. 1 shows a plasma processing apparatus according to one embodiment.

Hereinafter, various exemplary embodiments will be described.

Output waves used for plasma generation may be microwaves. In this case, the frequency of the output waves absorbed by plasma may vary depending on a state of generated plasma. The frequency of the output waves can be adjusted to correspond to such variation using a matching device. However, the frequency adjustment using the matching device may not follow the variation in the plasma state in a timely manner due to delay caused by a mechanical operation of the matching device.

A plasma processing apparatus is provided in accordance with one exemplary embodiment. The plasma processing apparatus comprises a chamber, a microwave output device and a controller. The microwave output device is configured to output microwaves provided into the chamber via a waveguide and an antenna. The controller is configured to control an operation of the microwave output device. The microwaves outputted by the microwave output device include an output wave for transmitting a power used for plasma generation and a broadband sweep wave group used for detection of a plasma state in the chamber. The microwave output device includes a modulator and a demodulator. The modulator is configured to modulate the microwaves and transmit the modulated microwaves to the waveguide. The demodulator is configured to receive, via the waveguide, and demodulate a reflected wave group obtained by the sweep wave group being reflected by plasma in the chamber, the sweep wave group being included in the microwaves transmitted to the waveguide by the modulator and provided into the chamber via the antenna. The controller is configured to determine a frequency of the output wave based on the reflected wave group, and control the microwave output device to output the output wave of the frequency.

The reflected wave group generated when the broadband sweep wave group is reflected by the plasma indicates the frequency of the microwaves absorbed by the plasma. Therefore, by using the reflected wave group, the output wave of the frequency that is effective for plasma excitation can be easily generated in a timely manner in response to variation in the plasma state.

In accordance with one exemplary embodiment, the controller is configured to obtain a first frequency of a sweep wave having the lowest reflectance in the sweep wave group based on the reflected wave group, and to control the microwave output device to output the output wave of the first frequency.

In accordance with one exemplary embodiment, the controller determines that a first frequency obtained at a first timing is not within a band of a preset bandwidth including a first frequency obtained at a second timing prior to the first timing. In this case, the controller is configured to control the microwave output device to output the output wave of the first frequency obtained at the first timing.

In accordance with one exemplary embodiment, the controller determines that a first frequency obtained at a first timing is not within a preset band. In this case, the controller is configured to control the microwave output device to output the output wave of the first frequency obtained at the first timing.

In accordance with one exemplary embodiment, the controller is configured to control the microwave output device to output a plurality of output waves having a plurality of first frequencies obtained at a plurality of timings.

In accordance with one exemplary embodiment, the controller is configured to obtain a frequency spectrum of the reflected wave group, and control the microwave output device to determine the frequency of the output wave such that a difference between the frequency spectrum and a reference frequency spectrum obtained in advance is reduced.

In accordance with one exemplary embodiment, the power of the output wave is 5000 W or less, and the frequency of the output wave is 2400 to 2500 MHz.

In accordance with one exemplary embodiment, the power of a sweep wave included in the sweep wave group is less than the power of the output wave, and is 50 W or less.

Hereinafter, various exemplary embodiments will be described in detail with reference to the accompanying drawings. Like reference numerals will be used for like or corresponding parts throughout the drawings.

FIG. 1 shows a plasma processing apparatus according to one embodiment. As shown in FIG. 1, the plasma processing apparatus 1 includes a chamber 12 and a microwave output device MW. The plasma processing apparatus 1 may further include a stage 14, an antenna 18, and a dielectric window 20.

The chamber 12 provides a processing space S therein. The chamber 12 has a sidewall 12*a* and a bottom portion 12*b*. The sidewall 12*a* is formed in a substantially cylindrical shape. The central axis of the sidewall 12*a* substantially coincides with the axis Z extending in the vertical direction. The bottom portion 12*b* is disposed on the lower end side of the sidewall 12*a*. An exhaust hole 12*h* for exhaust gases is disposed at the bottom portion 12*b*. The sidewall 12*a* has an opening at the upper end thereof.

A dielectric window 20 is disposed above the upper end of the sidewall 12*a*. The dielectric window 20 has a bottom surface 20*a* facing the processing space S. The dielectric window 20 closes the opening at the upper end of the sidewall 12*a*. An O-ring 19 is interposed between the dielectric window 20 and the upper end of the sidewall 12*a*. The chamber 12 is more reliably sealed by the O-ring 19.

The stage 14 is accommodated in the processing space S. The stage 14 is disposed to face the dielectric window 20 in the vertical direction. The stage 14 is disposed such that the processing space S is interposed between the dielectric window 20 and the stage 14. The stage 14 is configured to support a wafer WP placed thereon.

In one embodiment, the stage 14 includes a base 14*a* and an electrostatic chuck 14*c*. The base 14*a* has a substantially disc shape, and is made of a conductive material such as aluminum or the like. The central axis of the base 14*a* substantially coincides with the axis Z. The base 14*a* is supported by a cylindrical support 48. The cylindrical support 48 is made of an insulating material, and extends vertically upward from the bottom portion 12*b*. A conductive cylindrical support 50 is disposed at the outer periphery of the cylindrical support 48. The cylindrical support 50 extends vertically upward from the bottom portion 12*b* of the chamber 12 along the outer periphery of the cylindrical support 48. An annular exhaust path 51 is formed between the cylindrical support 50 and the sidewall 12*a*.

A baffle plate 52 is disposed at the upper portion of the exhaust path 51. The baffle plate 52 has an annular shape. A plurality of through-holes are formed in the baffle plate 52 to penetrate through the baffle plate 52 in the plate thickness direction. The above-described exhaust hole 12*h* is disposed below the baffle plate 52. An exhaust device 56 is connected to the exhaust hole 12*h* through an exhaust line 54. The exhaust device 56 has an automatic pressure control valve (APC) and a vacuum pump such as a turbo molecular pump. The exhaust device 56 can reduce a pressure in the processing space S to a desired vacuum level.

The base 14*a* also serves as a radio frequency (RF) electrode. An RF power supply 58 for RF bias is electrically connected to the base 14*a* via a power supply rod 62 and a matching device 60. The RF power supply 58 outputs a constant frequency, e.g., a high frequency of 13.56 MHz, at a set power suitable for controlling energy of ions attracted to the wafer WP.

Further, the RF power supply 58 may have a pulse generator, and may perform pulse modulation of the high-frequency power (RF power) and apply it to the base 14*a*. In that case, the RF power supply 58 performs the pulse modulation to obtain the RF power in which a high level power and a low level power are periodically repeated. The RF power supply 58 adjusts a pulse based on a synchronization signal PSS-R generated by the pulse generator. The synchronization signal PSS-R is a signal that determines the period and the duty ratio of the RF power. As an example of setting for the pulse modulation, the pulse frequency is 10 Hz to 50 kHz, and the pulse duty ratio (the ratio of the high level power time to the pulse period) is 10% to 90%.

The matching unit 60 accommodates a matching device for matching the impedance on the RF power supply 58 side with the impedance on the load side, mainly the electrode, the plasma, and the chamber 12. The matching device includes a blocking capacitor for generating a self-bias. When the RF power is pulse-modulated, the matching unit 60 operates to perform matching based on the synchronization signal PSS-R.

The electrostatic chuck 14*c* is disposed on the upper surface of the base 14*a*. The electrostatic chuck 14*c* holds the wafer WP by an electrostatic attractive force. The electrostatic chuck 14*c* includes an electrode 14*d*, an insulating film 14*e*, and an insulating film 14*f*, and is formed substantially in a disc shape. The central axis of the electrostatic chuck 14*c* substantially coincides with the axis Z. The electrode 14*d* of the electrostatic chuck 14*c* is formed of a conductive film, and is disposed between the insulating films 14*e* and 14*f*. A DC power supply 64 is electrically connected to the electrode 14*d* via a switch 66 and a coated wire 68. The electrostatic chuck 14*c* can attract and hold the wafer WP by the Coulomb force generated by a DC voltage applied from the DC power supply 64. A focus ring 14*b* is disposed on the base 14*a*. The focus ring 14*b* is disposed to surround the wafer WP and the electrostatic chuck 14*c*.

A coolant space 14*g* is formed in the base 14*a*. The coolant space 14*g* is formed to extend about the axis Z, for example. A coolant from a chiller unit is supplied to the coolant space 14*g* through a line 70. The coolant supplied to the coolant space 14*g* is returned to the chiller unit through a line 72. By controlling the temperature of the coolant with the chiller unit, the temperature of the electrostatic chuck 14*c* is controlled and, further, the temperature of the wafer WP is controlled.

A gas supply line 74 is formed in the stage 14. The gas supply line 74 is provided to supply a heat transfer gas, e.g., He gas, to a gap between the upper surface of the electrostatic chuck 14*c* and the backside of the wafer WP.

Referring back to FIG. 1, the plasma processing apparatus 1 further includes a waveguide 21, a tuner 26, and a coaxial waveguide 28. The microwave output device MW is connected to one end of the waveguide 21 (the microwave output device MW will be described later in detail). The other end of the waveguide 21 is connected to the coaxial waveguide 28. The waveguide 21 is a rectangular waveguide, for example. The waveguide 21 is provided with the tuner 26. The tuner 26 has stubs 26*a*, 26*b*, and 26*c*. Each of the stubs 26*a*, 26*b*, and 26*c* is configured to adjust the protrusion amount thereof with respect to the inner space of the waveguide 21. The tuner 26 adjusts the protruding positions of the stubs 26*a*, 26*b*, and 26*c* with respect to a reference position, thereby matching the impedance of the microwave output device MW with the impedance of the load, e.g., the chamber 12.

The coaxial waveguide 28 includes an outer conductor 28*a* and an inner conductor 28*b*. The outer conductor 28*a* has a substantially cylindrical shape, and the central axis line thereof substantially coincides with the axis line Z. The inner conductor 28*b* has a substantially cylindrical shape, and extends inside the outer conductor 28*a*. The central axis line of the inner conductor 28*b* substantially coincides with the axis line Z. The coaxial waveguide 28 transmits microwave outputted from the microwave output device MW through the waveguide 21 to the antenna 18.

The antenna 18 is disposed on a surface 20*b* opposite to the bottom surface 20*a* of the dielectric window 20. The antenna 18 includes a slot plate 30, a dielectric plate 32, and a cooling jacket 34.

The slot plate 30 is disposed on the surface 20*b* of the dielectric window 20. The slot plate 30 is made of a conductive metal, and has a substantially disc shape. The central axis of the slot plate 30 substantially coincides with the axis Z. A plurality of slot holes 30*a* are formed in the slot plate 30. In one example, the plurality of slot holes 30*a* constitute a plurality of slot pairs. Each of the plurality of slot pairs includes two slot holes 30*a* having a substantially long hole shape extending in directions intersecting each other. The plurality of slot pairs are arranged along one or more concentric circles around the axis Z. A through-hole 30*d* through which a conduit 36 to be described later can pass is formed at the center of the slot plate 30.

The dielectric plate 32 is disposed on the slot plate 30. The dielectric plate 32 is made of a dielectric material such as quartz, and has a substantially disc shape. The central axis of the dielectric plate 32 substantially coincides with the axis Z. The cooling jacket 34 is disposed on the dielectric plate 32. The dielectric plate 32 is disposed between the cooling jacket 34 and the slot plate 30.

The surface of the cooling jacket 34 has conductivity. A flow path 34*a* is formed in the cooling jacket 34. The flow path 34*a* is configured to supply a coolant. The lower end of the outer conductor 28*a* is electrically connected to the upper surface of the cooling jacket 34. The lower end of the inner conductor 28*b* is electrically connected to the slot plate 30 through a hole formed in the central portions of the dielectric plate 32 and the cooling jacket 34.

The microwaves from the coaxial waveguide 28 propagate through the dielectric plate 32, and are supplied to the dielectric window 20 from the multiple slot holes 30*a* of the slot plate 30. The microwaves supplied to the dielectric window 20 are introduced into the processing space S.

The conduit 36 passes through the inner hole of the inner conductor 28*b* of the coaxial waveguide 28. As described above, the through-hole 30*d* through which the conduit 36 can pass is formed in the central portion of the slot plate 30. The conduit 36 extends through the inner hole of the inner conductor 28*b*, and is connected to the gas supply system 38.

The gas supply system 38 supplies a processing gas for processing the wafer WP to the conduit 36. The gas supply system 38 may include a gas source 38*a*, a valve 38*b*, and a flow rate controller 38*c*. The gas source 38*a* is a processing gas source. The valve 38*b* switches supply and stop of supply of the processing gas from the gas source 38*a*. The flow rate controller 38*c* is, e.g., a mass flow controller, and adjusts the flow rate of the processing gas from the gas source 38*a*.

The plasma processing apparatus 1 may further include an injector 41. The injector 41 supplies the gas from the conduit 36 to the through-hole 20*h* formed in the dielectric window 20. The gas supplied to the through-hole 20*h* of the dielectric window 20 is supplied to the processing space S. The gas is excited by microwaves introduced from the dielectric window 20 to the processing space S. Accordingly, plasma is generated in the processing space S, and the wafer WP is processed by active species such as ions and/or radicals from the plasma.

The plasma processing apparatus 1 further includes a controller 100. The controller 100 controls individual components of the plasma processing apparatus 1. In particular, the controller 100 is configured to control the operation of the microwave output device MW. The controller 100 may include a processor such as a central processing unit (CPU), a user interface, and a storage part.

The processor executes a program and a process recipe stored in the storage part to collectively control the individual components such as the microwave output device MW, the stage 14, the gas supply system 38, and the exhaust device 56.

The user interface includes a keyboard or a touch panel for a process manager to input commands to manage the plasma processing apparatus 1, and a display for visualizing and displaying an operating status of the plasma processing apparatus 1.

The storage part stores the control program (software) for realizing various processes executed by the plasma processing apparatus 1 under the control of the processor, and the process recipe including processing condition data, or the like. The processor reads out and executes various control programs from the storage part, if necessary, such as instructions from the user interface. Under the control of the processor, desired processing is performed in the plasma processing apparatus 1.

The microwave output device MW outputs microwaves (output waves) for exciting the processing gas supplied into the chamber 12. The microwave output device MW is configured to output microwaves provided into the chamber 12 via the waveguide 21 and the antenna 18. The microwave output device MW is configured to variably adjust the frequency, the power, and the bandwidth of the microwaves.

The microwave output device MW can output single-frequency microwaves (e.g., output waves used for plasma generation) by setting the bandwidth of the microwave to approximately 0, for example. The microwave output device MW can output microwaves (e.g., a sweep wave group used for detecting a plasma state) having a bandwidth having multiple frequency components therein.

The powers of the multiple frequency components may be the same, or only the central frequency component in the band may have a power greater than powers of the other frequency components. In one example, the microwave output device MW can adjust the microwave power within a range of 0 W to 5000 W.

The microwave output device MW can adjust the frequency or the center frequency of the microwaves within a range of 2400 MHz to 2500 MHz. The microwave output device MW can adjust the bandwidth of the microwaves within a range of 0 MHz to 100 MHz. The microwave output device MW can adjust the frequency pitch (carrier pitch) of the multiple frequency components of the microwaves in the band within a range of 0 to 25 kHz.

The power of the sweep wave included in the sweep wave group may be less than the power of the output wave and may be 50 W or less.

Next, the microwave output device MW will be described in detail. The microwave output device MW has a signal wave controller 15, a modulator 16, and a demodulator 17. The modulator 16 is configured to modulate the microwaves and output them as traveling waves Pf to the waveguide 21. The microwaves (traveling waves Pf) outputted by the modulator 16 include an output wave that transmit a power used for plasma generation, and a broadband sweep wave group used for detecting a plasma state in the chamber 12. The demodulator 17 is configured to receive and demodulate a reflected wave group (reflected waves Pr) that is the sweep wave group reflected by the plasma in the chamber 12 via the waveguide 21. The signal wave controller 15 is configured to control the generation of microwaves by the modulator 16 based on the traveling waves Pf and the reflected waves Pr (by performing feedback of the traveling waves Pf and the reflected waves Pr).

Figure 2:
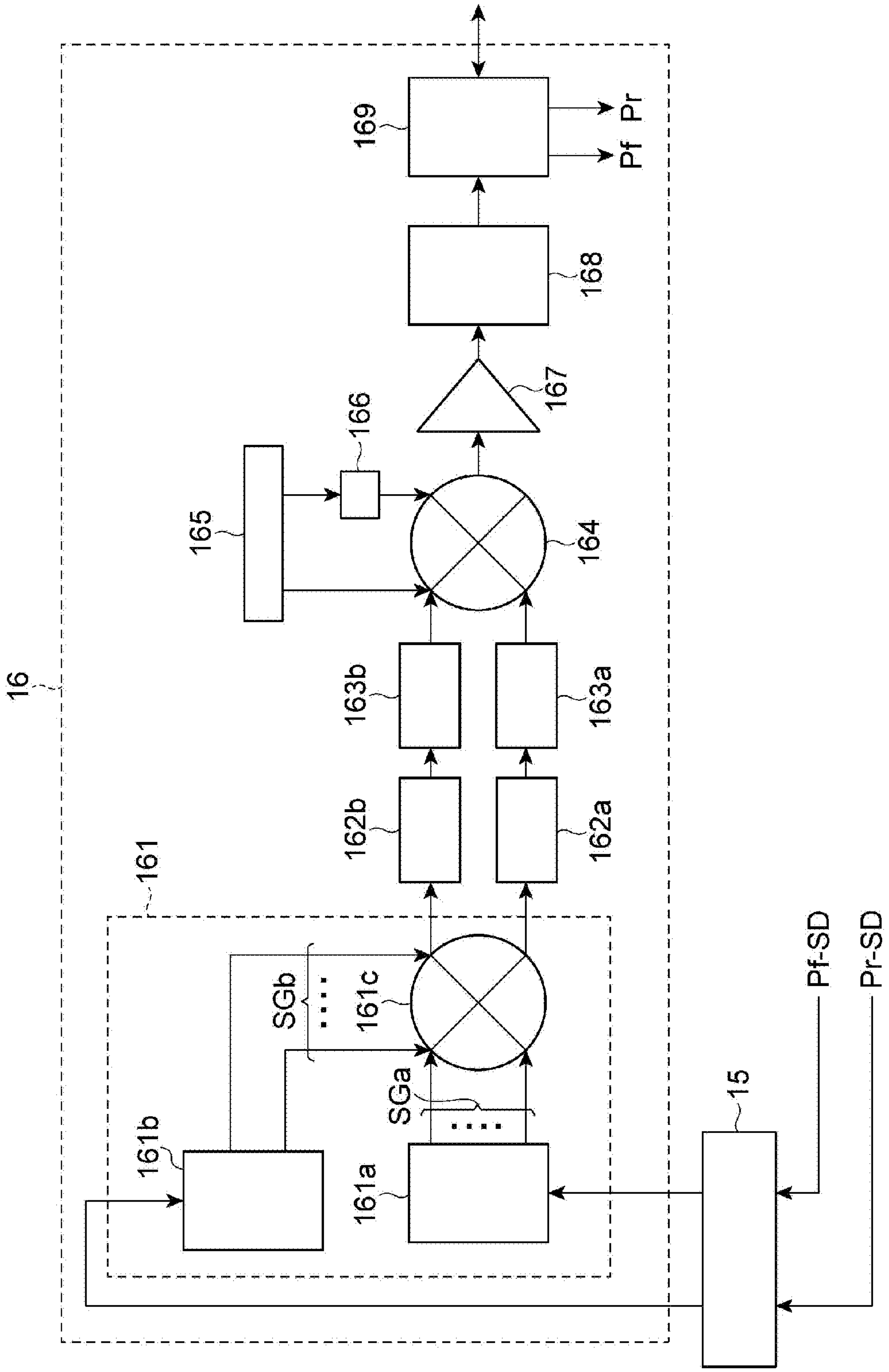
FIG. 2 shows an example of a modulator.

The modulator 16 will be described with reference to FIG. 2. The modulator 16 has a baseband signal generator 161, D/A converters 162*a* and 162*b*, low-pass filters 163*a* and 163*b*, an IQ modulator 164, a PLL oscillator 165, and a phase adjuster 166. The modulator 16 further includes an amplifier 167, a bandpass filter 168, and a directional coupler 169. The baseband signal generator 161 includes a sweep wave group output part 161*a*, an output wave output part 161*b*, and an inverse Fourier transform part 161*c*.

The microwave output device MW includes a signal wave controller 15. The sweep wave group output part 161*a* uses digital data related to the sweep wave group provided by the signal wave controller 15 of the microwave output device MW to transmit a signal group SGa related to the sweep wave group to the inverse Fourier transform part 161*c*. The output wave output part 161*b* uses digital data related to the output wave provided by the signal wave controller 15 to transmit a signal group SGb related to the output wave to the inverse Fourier transform part 161*c*. The inverse Fourier transform part 161*c* transmits signal waves obtained by combining the signal group SGa and the signal group SGb and performing inverse Fourier transformation to the D/A converter 162*b* to obtain an analog signal. The inverse Fourier transform part 161*c* transmits signal waves obtained by combining the signal group SGa and the signal group SGb and performing inverse Fourier transformation to the D/A converter 162*a* to obtain an analog signal.

The IQ modulator 164 modulates the analog signals (I signal and Q signal) transmitted from the D/A converter 162*a* and the D/A converter 162*b* using a signal from the PLL oscillator 165 and a signal whose phase has been shifted by 90 degrees by the phase adjuster 166. The signal (traveling waves Pf) modulated by the IQ modulator 164 is transmitted to the amplifier 167 and amplified. After high-frequency and low-frequency components thereof are removed by the bandpass filter 168, they are transmitted to the waveguide 21 via the directional coupler 169. The traveling waves Pf transmitted to the waveguide 21 includes the output wave and the sweep wave group.

Figure 3:
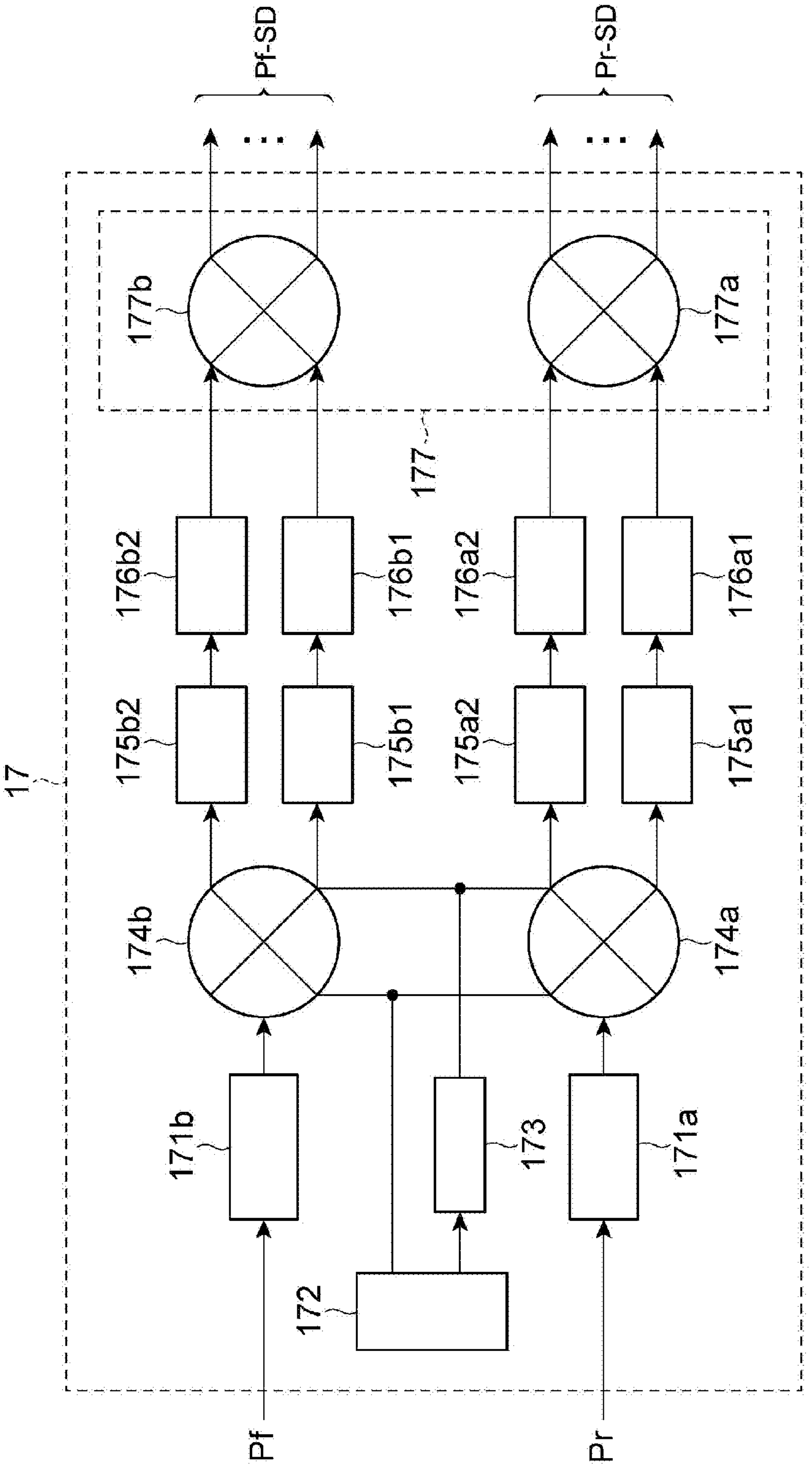
FIG. 3 shows an example of a demodulator.

The demodulator 17 will be described with reference to FIG. 3. The demodulator 17 includes bandpass filters 171*a* and 171*b*, a PLL oscillator 172, a phase adjuster 173, an IQ demodulator 174*a*, and an IQ demodulator 174*b*. The demodulator 17 further includes low pass filters 175*a*1, 175*a*2, 175*b*1, and 175*b*2. The demodulator 17 includes A/D converters 176*a*1, 176*a*2, 176*b*1, and 176*b*2, and a signal processing part 177. The signal processing part 177 includes Fourier transform parts 177*b* and 177*a*.

The bandpass filter 171*a* removes high-frequency and low-frequency components from the reflected waves Pr transmitted from the directional coupler 169 of the modulator 16. The bandpass filter 171*b* removes high-frequency and low-frequency components of the traveling waves Pf transmitted from the directional coupler 169.

The IQ demodulator 174*a* demodulates the reflected waves Pr of the analog signal transmitted through the bandpass filter 171*a* into the Q signal and the I signal using a signal from the PLL oscillator 172 and a signal whose phase has been shifted by 90 degrees by the phase adjuster 173. The Q signal and the I signal demodulated by the IQ demodulator 174*a* are transmitted to the low pass filters 175*a*1 and 175*a*2, respectively, and the high-frequency components thereof are removed. The Q signal transmitted through the lowpass filter 175*a*1 is converted into a digital signal by the A/D converter 176*a*1. The I signal transmitted through the lowpass filter 175*a*2 is converted into a digital signal by the A/D converter 176*a*2.

The IQ demodulator 174*b* demodulates the traveling waves Pf of the analog signal transmitted through the bandpass filter 171*b* into the Q signal and the I signal using a signal from the PLL oscillator 172 and a signal whose phase has been shifted by 90 degrees by the phase adjuster 173. The Q signal and the I signal demodulated by the IQ demodulator 174*b* are transmitted to the low pass filters 175*b*1 and 175*b*2, respectively, and the high-frequency components thereof are removed. The Q signal transmitted through the lowpass filter 175*b*1 is converted into a digital signal by the A/D converter 176*b*1. The I signal transmitted through the lowpass filter 175*b*2 is converted into a digital signal by the A/D converter 176*b*2.

The Fourier transform part 177*a* performs Fourier transformation on the Q signal from the A/D converter 176*a*1 and the I signal from the A/D converter 176*a*2, and transmits reflected wave spectrum data Pr-SD to the signal wave controller 15. The Fourier transform part 177*b* performs Fourier transformation on the Q signal from the A/D converter 176*b*1 and the I signal from the A/D converter 176*b*2, and transmits traveling wave spectrum data Pf-SD to the signal wave controller 15.

As described above, the microwave output device MW according to one embodiment outputs, in addition to the output wave used for plasma generation, the broadband sweep wave group used for detecting a plasma state, i.e., the impedance of the plasma, for each frequency. The sweep wave group includes a plurality of sweep waves with different frequencies. The power (intensity) of the sweep wave included in the sweep wave group is less than the power (intensity) of the output wave, and may be 50 W or less, for example. The microwave output device MW outputs the sweep wave group continuously (e.g., constantly) during the operation of the plasma processing apparatus 1. Each of the multiple sweep waves included in the sweep wave group has a frequency of each of the multiple reflected waves included in the reflected wave group.

Figure 4:
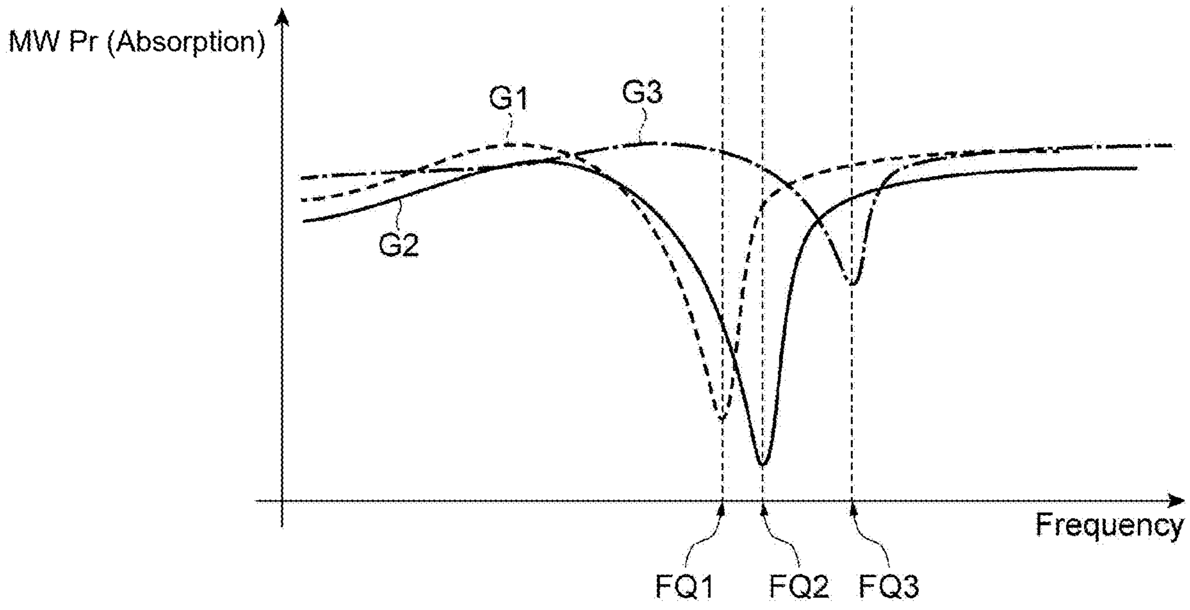
FIG. 4 explains an operation of the plasma processing apparatus illustrated in FIG. 1.

The frequency of the reflected waves absorbed by the plasma among the reflected wave group received by the microwave output device MW is the frequency with the lowest power in the frequency spectrum indicating the power (intensity) for the frequency of the reflected wave group. FIG. 4 shows an example of the frequency spectrum. The vertical axis represents the power (intensity) of the reflected wave group (MW Pr), and the horizontal axis represents the frequency included in the reflected wave group. The frequency with the lowest value in the vertical axis is the frequency absorbed by the plasma (Absorption). Curves G1, G2, and G3 indicate the frequency spectra of the reflected wave groups obtained from plasmas in different states. In the plasma state corresponding to the curve G1, microwaves of frequency FQ1 are absorbed by the plasma in the corresponding state (plasma impedance in the corresponding state is lowest in the microwaves of frequency FQ1, the same applies hereinafter). In the plasma state corresponding to the curve G2, microwaves of frequency FQ2 are absorbed by the plasma in the corresponding state. In the plasma state corresponding to the curve G3, microwaves of frequency FQ3 are absorbed by the plasma in the corresponding state.

The operation of the microwave output device MW, which will be described below, can be realized by the control of the controller 100. The operation of the microwave output device MW may be realized by the signal wave controller 15 of the microwave output device MW shown in FIG. 2.

The controller 100 can determine the frequency of the output wave based on the reflected wave group received by the microwave output device MW, and control the microwave output device MW to output the output wave of the determined frequency. In this case, PR1 to PR5 to be described below may be specific examples of control contents of the microwave output device MW executed by the controller 100.

(Control PR1) The controller 100 may obtain a first frequency (e.g., frequency of reflected waves having the lowest power (intensity) among the reflected wave group) of a sweep wave having the lowest reflectance among the sweep wave group based on the reflected wave group, and may control the microwave output device MW to output wave of the first frequency. For example, in the plasma states corresponding to the curves G1, G2, and G3 of FIG. 4, the frequencies FQ1, FQ2, and FQ3 correspond to the first frequency. The reflectance may be, e.g., a ratio (%) of the power (intensity) of the reflected waves to the power (intensity) of the sweep wave for each frequency.

(Control PR2) The controller 100 may determine that the first frequency obtained at the first timing is not within a preset bandwidth including the first frequency obtained at the second timing prior to the first timing. In other words, the controller 100 may determine that the first frequency obtained at the first timing is different from the first frequency obtained at the second timing. In this case, the controller 100 may control the microwave output device MW to output the output wave of the first frequency obtained at the first timing. For example, a case where the plasma state at the first timing is the plasma state corresponding to the curve G3, and the plasma state at the second timing prior to the first timing is the plasma state corresponding to the curve G1 may be considered. In this case, the controller 100 may determine that the frequency FQ3 that is the first frequency obtained at the first timing is different from the frequency FQ1 that is the first frequency obtained at the second timing. Then, the controller 100 may control the microwave output device MW to output the output wave of the frequency FQ3 obtained at the first timing.

(Control PR3) The controller 100 may determine that the first frequency obtained at the first timing is not within the preset band. In this case, the controller MW may control the microwave output device MW to output the output wave of the first frequency obtained at the first timing. For example, a case where the plasma state at the first timing is the plasma state corresponding to the curve G3 may be considered. In this case, the controller 100 determines that the frequency FQ3 that is the first frequency obtained at the first timing is not within a preset band (e.g., a band that includes the frequency FQ1 and not includes the frequency FQ3). Accordingly, the controller 100 can control the microwave output device MW to output the output wave of the frequency FQ3 obtained at the first timing.

(Control PR4) The controller 100 can control the microwave output device MW to output a plurality of output waves, each having a plurality of first frequencies obtained at a plurality of timings. For example, a case where the plasma state at the first timing is the plasma state corresponding to the curve G3, and the plasma state at the second timing is the plasma state corresponding to the curve G1 may be considered. It is assumed that the second timing is prior to the first timing. In this case, the controller 100 can control the microwave output device MW to simultaneously (or repeatedly sequentially) output the output wave of the frequency FQ1 obtained at the first timing and the frequency FQ2 obtained at the second timing. The first timing and the second timing are two most recent timings, and the number of recent timings is not limited to two, and may be two or more (plural).

(Control PR5) The controller 100 can obtain the frequency spectrum of the reflected wave group, and control the microwave output device MW to determine the frequency of the output wave such that the difference between the obtained frequency spectrum and a reference frequency spectrum obtained in advance is reduced. For example, a case where the controller 100 obtains the frequency spectrum of the reflected wave group corresponding to the curve G1, and has obtained in advance the reference frequency spectrum corresponding to the curve G3 may be considered. In this case, the controller 100 can control the microwave output device MW to determine the frequency of the output wave such that the difference between the frequency spectrum corresponding to the curve G1 and the reference frequency spectrum corresponding to the curve G3 is reduced. The reduction in the difference between the two spectra may indicate that the difference between the spectra for each frequency is within a preset range, for example.

In accordance with the plasma processing apparatus 1, the reflected wave group generated by the reflection of the broadband sweep wave group by the plasma indicates the frequency of the microwave absorbed by the plasma. Since the frequency of the output wave is determined using the reflected wave group in the plasma processing apparatus 1, the output wave with a frequency effective for plasma excitation can be easily generated in a timely manner in response to variation in the plasma state.

While various embodiments have been described above, the present disclosure is not limited to the above-described embodiments, and various additions, omissions, substitutions and changes may be made. Further, other embodiments can be implemented by combining elements in different embodiments.

From the above description, it will be appreciated that various embodiments of the present disclosure have been described herein for purposes of illustration, and that various changes may be made without departing from the scope and spirit of the present disclosure. Therefore, the various embodiments disclosed herein are not intended to be limiting, with a true scope and spirit being indicated by the following claims.

DESCRIPTION OF REFERENCE NUMERALS

1: plasma processing apparatus
100: controller
12: chamber
16: modulator
17: demodulator
18: antenna
21: waveguide
MW: microwave output device

The invention claimed is:

1. A plasma processing apparatus comprising:
a chamber;
a microwave output device configured to output microwaves provided into the chamber via a waveguide and an antenna; and
a controller configured to control an operation of the microwave output device;
wherein the microwaves outputted by the microwave output device include an output wave that transmits a power used for plasma generation and a broadband sweep wave group used for detection of a plasma state in the chamber,
the microwave output device includes a modulator configured to modulate the microwaves and transmit the modulated microwaves to the waveguide, and a demodulator configured to receive, via the waveguide, and demodulate a reflected wave group obtained by the broadband sweep wave group being reflected by plasma in the chamber, the broadband sweep wave group being included in the microwaves transmitted to the waveguide by the modulator and provided into the chamber via the antenna,
the controller is configured to determine a frequency of the output wave based on the reflected wave group, and control the microwave output device to output the output wave of the frequency, and
the controller is configured to obtain a first frequency of a sweep wave having a lowest reflectance in the broadband sweep wave group based on the reflected wave group, and to control the microwave output device to output the output wave of the first frequency.

2. The plasma processing apparatus of claim 1, wherein the controller is configured to control the microwave output device to output the output wave of a first frequency obtained at a first timing when it is determined that the first frequency obtained at the first timing is not within a band of a preset bandwidth including a first frequency obtained at a second timing prior to the first timing.

3. The plasma processing apparatus of claim 1, wherein the controller is configured to control the microwave output device to output the output wave of a first frequency obtained at a first timing when it is determined that the first frequency obtained at the first timing is not within a preset band.

4. The plasma processing apparatus of claim 1, wherein the controller is configured to control the microwave output device to output a plurality of output waves having a plurality of first frequencies obtained at a plurality of timings.

5. The plasma processing apparatus of claim 1, wherein the controller is configured to obtain a frequency spectrum of the reflected wave group, and control the microwave output device to determine the frequency of the output wave such that a difference between the frequency spectrum and a reference frequency spectrum obtained in advance is reduced.

6. The plasma processing apparatus of claim 1, wherein the power of the output wave is 5000 W or less, and the frequency of the output wave is 2400 to 2500 MHz.

7. A plasma processing apparatus comprising:
a chamber;
a microwave output device configured to output microwaves provided into the chamber via a waveguide and an antenna; and
a controller configured to control an operation of the microwave output device;
wherein the microwaves outputted by the microwave output device include an output wave that transmits a power used for plasma generation and a broadband sweep wave group used for detection of a plasma state in the chamber,
the microwave output device includes a modulator configured to modulate the microwaves and transmit the modulated microwaves to the waveguide, and a demodulator configured to receive, via the waveguide, and demodulate a reflected wave group obtained by the broadband sweep wave group being reflected by plasma in the chamber, the broadband sweep wave group being included in the microwaves transmitted to the waveguide by the modulator and provided into the chamber via the antenna,
the controller is configured to determine a frequency of the output wave based on the reflected wave group, and control the microwave output device to output the output wave of the frequency, and
the power of a sweep wave included in the broadband sweep wave group is less than the power of the output wave, and is 50 W or less.

8. A plasma processing apparatus comprising:
a chamber;
a microwave output device configured to output microwaves provided into the chamber via a waveguide and an antenna; and
a controller configured to control an operation of the microwave output device;
wherein the microwaves outputted by the microwave output device include an output wave that transmits a power used for plasma generation and a broadband sweep wave group used for detection of a plasma state in the chamber,
the microwave output device includes a modulator configured to modulate the microwaves and transmit the modulated microwaves to the waveguide, and a demodulator configured to receive, via the waveguide, and demodulate a reflected wave group obtained by the broadband sweep wave group being reflected by plasma in the chamber, the broadband sweep wave group being included in the microwaves transmitted to the waveguide by the modulator and provided into the chamber via the antenna,
the controller is configured to determine a frequency of the output wave based on the reflected wave group, and control the microwave output device to output the output wave of the frequency, the power of the output wave is 5000 W or less, the frequency of the output wave is 2400 to 2500 MHz, and the power of a sweep wave included in the broadband sweep wave group is less than the power of the output wave, and is 50 W or less.

* * * * *